PRESSURE-SENSITIVE SEMICONDUCTOR MICROPHONE

Filed Sept. 23, 1964

3,389,233

PRESSURE-SENSITIVE SEMICONDUCTOR MICROPHONE

Friedrich Krieger, Gilching, Martin Sauer, Munich-Pasing, and Gert Conrad, Dachau, Germany, assignors to Siemens Aktiengesellschaft, Munich, Germany Filed Sept. 23, 1964, Ser. No. 398,711
Claims priority, application Germany, Sept. 30, 1963, S 87,645
13 Claims. (Cl. 179—110)

ABSTRACT OF THE DISCLOSURE

A transducer wherein a pressure member is elastically fixed with respect to a semiconductor to change the pressure thereon upon movement of the pressure member. A control member is supportably positioned in unsecured engagement with the pressure member, whereby changes in pressure applied to the control member are coupled to the pressure member.

In recent times disclosures have been made of semiconductor arrangements which are suitable for the transformation of mechanical pressures or movements into analogous electro-galvanic quantities. For instance, a transistor arrangement is described in the paper "Highly Sensitive Microphone Uses Transistor As Base," published in the Bell Laboratories Record of December 1962, pp. 418–19. Further, a diode arrangement for the same purpose is described in the article, "Piezo-Functions: Elements of a New Class of Semiconductor Devices," Proceedings of the I.R.E., October 1962, p. 2106.

The pressure-sensitive electric transducers of this kind made known so far are experimental devices which are not really suitable for practical application and, in particular, for mass production. In the economic utilization of the above-mentioned transducer principle, there exists the problem of construction of the transducer in the simplest possible way.

The present invention has for its object the solution of this problem, namely, the provision of a pressure-sensitive electric transducer containing a semiconductor having a p-n junction. The p-n junction is subjected to variable pressure by a sapphire point or the like which is supported in elastic fashion from the semiconductor or its support. In the embodiments to be described, the elements so far referred to can be formed into a sub-assembly which is threadable into the remaining elements of a microphone.

In arrangements disclosed prior to the present invention the sapphire point was fixedly attached to the control element, which was normally of course a membrane or the like. The adjustment of the point was provided for only after the transducer had been assembled. Of course it is realized that such adjustment is essential because the point has to be positioned with respect to the semiconductor in a very particular place. When the adjustment must be made after assembly of the transducer, difficulties are posed by reason of the fact that optical adjustment requires viewing openings which of course would have to be closed after adjustment, for acoustical reasons. In the present invention, in contrast, the adjustment process is directly associated with the semiconductor element. Indeed, the invention contemplates an independent sub-assembly or structural element which can be inserted without later adjustment, into the larger mechanical unit containing the control or sound-sensitive element.

The pressure-sensitive semiconductor of course is operative to transform mechanical pressures into analogous electro-galvanic magnitudes, such as changes in conductivity. If mechanical movements are to be transformed, however, the sapphire point cannot be rigidly fixed, but rather must employ an elastic fastener as an intermediate element between the pressure-sensitive membrane and the semiconductor.

The invention will now be more fully described in conjunction with exemplified embodiments thereof shown in the attached drawings.

Figure 1:
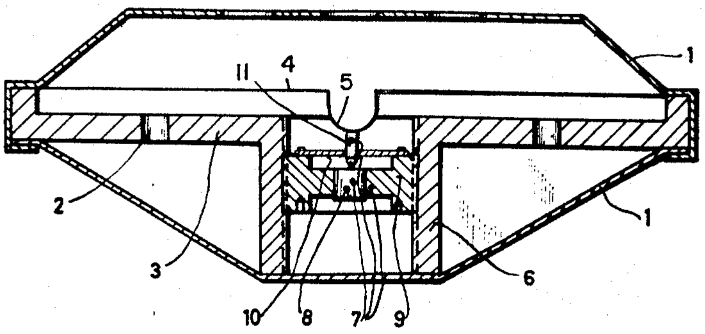
FIG. 1 is a cross sectional view through one embodiment of the invention.

Referring first to FIG. 1, the microphone includes a casing 1 having a supporting body 3 provided with acoustically effective openings 2. The membrane provided for response to sound pressure is supported along its periphery on the supporting body 3 and is provided with a hemispherical protrusion 5, in similar fashion to the membranes of known carbon microphones.

The supporting body 3 has a cylindrical portion 6 into which an appropriate electrical winding may be recessed. The walls of the cylindrical portion define an inner passage which extends outwardly from the central boss or protrusion 5 on the membrane 4.

A sub-assembly 7 (which is more readily seen in FIG. 2) is threaded into the passage defined by the cylindrical portion 6. This sub-assembly consists of the pressure-dependent semiconductor 8, the carrier 9 to which the semiconductor is attached, the holding spring 10, and the sapphire point 11. It will be seen that the sapphire is not fastened to the membrane, as in previously-known assemblies, but rather is fastened to the carrier 9 for the semiconductor, by means of the holding spring. As a result, the point forms a part of the mechanical unit including the semiconductor.

In assembly of the electro-acoustical transducer, after preliminary adjustment of the sapphire point, sub-assembly 7 is threaded into the cylindrical part 6 of the supporting body 3 until the sapphire touches the membrane. The optimum mechanical pressure initial stress can be determined in simple manner, using acoustic techniques, if the semiconductor is placed in a circuit containing a receiver or measuring instrument. When the sapphire touches the uniformly-loaded membrance upon the insertion of the sub-assembly 7, the electro-galvanic quantity made audible or visible by the measuring apparatus or receiver is of course changed, and the adjustment may be made until the optimum setting is found.

The space below the sub-assembly 7 is of course especially well adapted for location of electrical switching elements which complete the connection of the semiconductor arrangement to the desired circuit.

Figure 2:
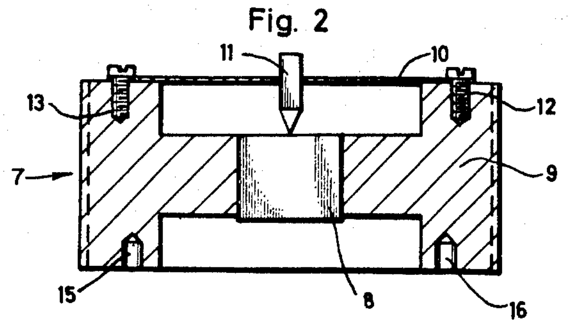
FIG. 2 is a cross sectional view, on a larger scale, through the sub-assembly forming an element of the apparatus of FIG. 1.
Figure 3:
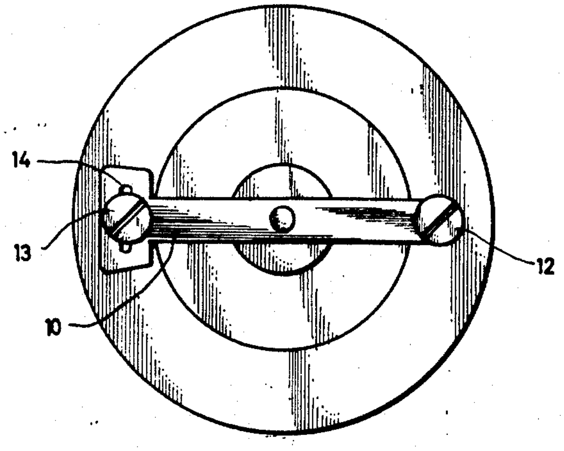
FIG. 3 is a plan view of the apparatus of FIG. 2.

As indicated more clearly by FIGS. 2 and 3, the holding spring 10 is a leaf spring which mounts the sapphire point in its center. The spring is fastened to the supporting body 9 at opposite ends by means of respective screws 12 and 13. At one end, the leaf spring has an enlarged portion provided with a slit opening 14 through which the fastening screw 13 extends. Through use of this slit, it is possible to adjust the position of the leaf spring, and therefore of the sapphire point, within a limited range. The sapphire point therefore can be moved into the proper place microscopically and fixed in position by means of screws 12 and 13.

Bore holes 15 and 16 on the bottom of the carrier 9 are intended as holes for the key which may be employed to thread the sub-assembly 7 into the supporting body 6.

It will be evident that the holding spring serves to hold the adjusted sapphire point in the right position. However, the proper initial stress can also be effected by the spring.

Figure 4:
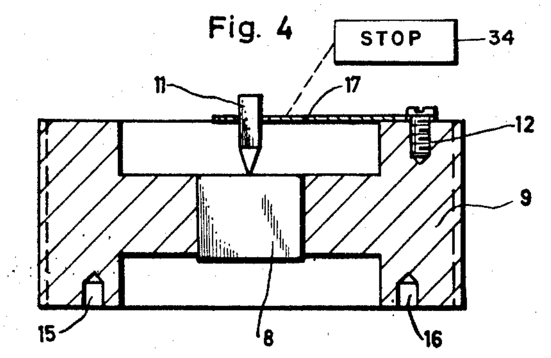
FIG. 4 is a sectional view similar to FIG. 2, but showing a modified spring fastener for the apparatus of the invention.
Figure 5:
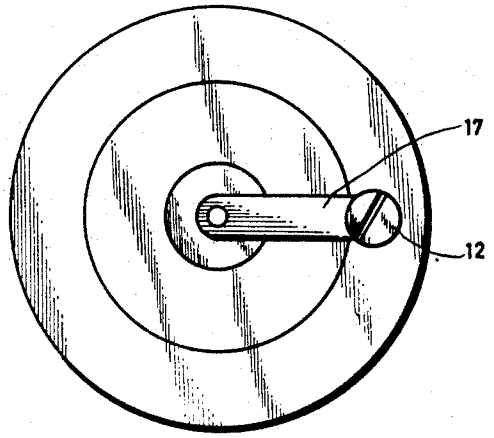
FIG. 5 is a plan view of the apparatus of FIG. 4.

FIGS. 4 and 5 show a slightly different sub-assembly which includes a cantilever-supported leaf spring 17. That is, the leaf spring 17 is supported only at one end thereof from the supporting body 9, and the sapphire point 11 is mounted between the ends, but adjacent the free end of the spring. It will be evident that a suitable stop 34 can be provided to limit the movement of the cantilever-supported spring 17 in FIGS. 4 and 5.

Figure 6:
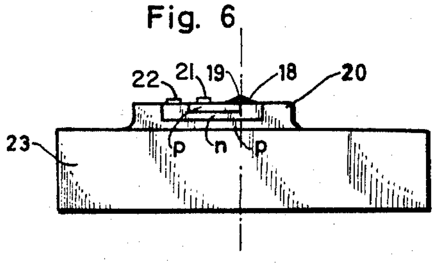
FIG. 6 is an elevational view of a modified embodiment of a portion of the apparatus.

FIG. 6 shows a different type of sub-assembly employing an adhesive 18 as the elastic fastener. This adhesive is of the type which is still elastic when in its set condition, but which serves to fasten the sapphire with respect to the semiconductor. In FIG. 6 the sapphire 19 is a ball of suitable diameter which is positioned in a proper location on the semiconductor 20 and is glued thereto. The suitable location is the p-n transition or junction of the semiconductor. In the exemplary embodiment of FIG. 6, the semiconductor is shown as a transistor of the so-called planar type. In this type of semiconductor the proper location for the sapphire point is the p-n- junction between the emitter electrode 21 and the base electrode 22.

The semiconductor transistor is glued on a support 23 which, in fashion similar to the carrier 9 of FIG. 1, can be inserted into a transducer casing. The control part in this embodiment, a membrane as before, must be brought into contact with the sapphire ball.

Figure 7:
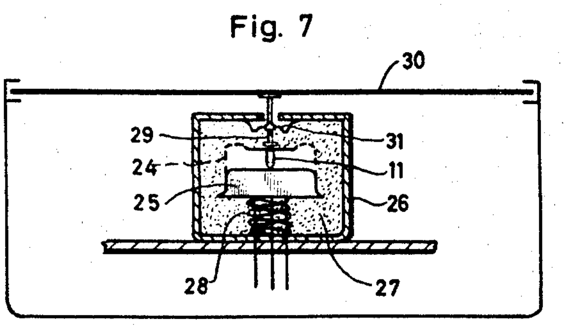
FIG. 7 is a view, partly in section, showing a further embodiment of the apparatus.

In the exemplary embodiment of FIG. 7 a pot-shaped covering top 24 is provided for the apparatus and serves as the holding spring for the sapphire 11. In a manner not shown in the drawing, the semiconductor material is placed on the support 25 of the semiconductor and maintained in position thereon. In this execution of the invention the method of adjustment can be readily carried out by provision of openings on the side of the covering top which will allow optical examination, and by maintaining the semiconductor plate on the base in movable fashion until the adjustment, whereafter it may be fixed by such as an adhesive. The openings in the covering cap then can be closed without difficulty, so that the piezo transistor, and the sapphire point, can form an enclosed structural element.

In the case of the apparatus of FIG. 7 this structural element is placed in a casing 26 wherein a silicone grease 27 surrounds the structural element. The top, serving as a spring-supporting element, can be pressed or placed in abutting relationship with a plunger or piston 29, by means of a low pressure spring 28 which urges the structural sub-assembly in such direction that the elastic fastener 24 and its supported sapphire are engaged by the piston. The piston 29 may then be fixed to the membrane 30 for movement therewith, so that changes in pressure on the membrane will be in turn transmitted into changes in pressure of the sapphire upon the semiconductor junction.

A cuff 31 may be provided for permitting passage of the piston into the enclosed chamber, but maintaining a seal of that chamber.

It will be evident that the pressure spring 28 presses sapphire 11 against the plunger 29 via the transistor with a constant initial stress. Since a mass-spring system is thereby constituted, the grease in the casing is provided as a frictional element to reduce characteristic vibration. A particularly suitable grease is a silicone type whose viscosity increases with speed. As a consequence, slow-form changes, pressure fluctuations, etc. are equalized but the system cannot follow quick fluctuations such as sound vibrations, so that the sound vibrations are immediately translated into changes in pressure on the semiconductor junction.

Further, the grease obviously affords the additional advantage of protecting the apparatus against moisture.

Figure 8:
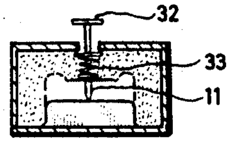
FIG. 8 is a partly sectional view showing a further embodiment of the apparatus.

It will be evident that the sapphire point can be permitted to move only a short distance. Consequently, the arrangements previously described are not directly suitable for the transformation of movements in the order of millimeters in distance, into an analogous electro-galvanic quantity. If this is to be done, another transformation member may be inserted between the control member and the sapphire, to transform the movement into pressure. A properly proportioned spring is suitable as such a transformation member. The apparatus of FIG. 8 shows a suitable arrangement, in which a spring 33 is inserted between the control member 32 and the sapphire 11.

It will be evident that the control member referred to in this application is the membrane normally associated with a microphone. It will further be evident that many minor changes could be made in the construction of the apparatus of the invention, without departure from the scope thereof. Accordingly, the invention is not to be considered limited to the embodiments specifically described herein, but rather only by the scope of the appended claims.

We claim:

1. A microphone comprising
- a p-n junction semiconductor whose conductive characteristics change with pressure thereon,
- a pressure member elastically fixed with respect to said semiconductor to change the pressure thereon upon movement of the pressure member,
- a control member positioned for movement in response to pressure changes thereon,
- support means positioning the control and pressure members in unsecured engagement to couple the control member's response to pressure changes thereon to the pressure member.

2. The apparatus of claim 1 in which said pressure member is a sapphire point.

3. The apparatus of claim 2 including an elastic fastener for supporting the pressure member with respect to the semiconductor, said fastener being releasably attached to the semiconductor.

4. The apparatus of claim 3 in which said fastener is adjustably movable to vary the position of the pressure member with respect to the semiconductor.

5. The apparatus of claim 2 including an adhesive mounting said pressure member upon said semiconductor, said adhesive being elastic when set.

6. The apparatus of claim 2 including a carrier to which said semiconductor is attached,
- and an elastic fastener carrying the pressure member and fixed to said carrier.

7. The apparatus of claim 6 in which said fastener is a leaf spring.

8. The apparatus of claim 7 in which the leaf spring has one only of its ends fastened to said carrier, with said pressure member mounted between its ends,
- and a stop for limiting movement of the spring.

9. The apparatus of claim 7 in which both ends of said leaf spring are fastened to said carrier, with said pressure member mounted between said ends.

10. The apparatus of claim 6 in which a pot-shaped covering cap for said semiconductor acts as said elastic fastener.

11. The apparatus of claim 10 including spring means urging the semiconductor toward said cap.

12. The apparatus of claim 2 including a casing in which the semiconductor is mounted and containing a silicone grease surrounding the semiconductor and pressure member.

13. The apparatus of claim 2 in which said control member is a membrane, and including a supporting body mounting said membrane for movement of its inner portions, said body having a cylindrical surface defining a threaded passage extending outwardly from adjacent the central portion of said membrane, a cylindrical carrier to which said semiconductor is fixed centrally thereof, said carrier having a threaded cylindrical surface engageable with the threads in the cylindrical surface of said body portion, and a leaf spring attached to said carrier supporting said sapphire point between its ends in abutting relationship to the p-n junction of said semiconductor, said sapphire point being positioned centrally of said carrier for movement into abutting relationship with said membrane when the carrier is threaded into the supporting body.

References Cited

UNITED STATES PATENTS

| | | | |
|---|---|---|---|
| 2,632,062 | 3/1953 | Montgomery | 179—121 |
| 3,215,787 | 11/1965 | Hill | 179—110 |
| 3,295,085 | 12/1966 | Nelson | 317—235 |

FOREIGN PATENTS

Highly Sensitive Microphone Uses Transistor as Base, Bell Laboratories Record, December 1962, pp. 418–419.

KATHLEEN H. CLAFFY, *Primary Examiner.*

A. A. MCGILL, *Assistant Examiner.*